(12) United States Patent
Selvin et al.

(10) Patent No.: US 11,271,295 B1
(45) Date of Patent: Mar. 8, 2022

(54) MECHANICALLY MODULATED LOOPSTICK ANTENNA

(71) Applicant: HRL Laboratories, LLC, Malibu, CA (US)

(72) Inventors: Skyler Selvin, San Jose, CA (US); Walter S. Wall, Los Angeles, CA (US); Geoffrey P. McKnight, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/393,816

(22) Filed: Apr. 24, 2019

Related U.S. Application Data

(60) Provisional application No. 62/689,758, filed on Jun. 25, 2018.

(51) Int. Cl.
*H01Q 1/36* (2006.01)
*H01Q 3/44* (2006.01)
*H03C 7/02* (2006.01)

(52) U.S. Cl.
CPC ............... *H01Q 1/364* (2013.01); *H01Q 3/44* (2013.01); *H03C 7/02* (2013.01)

(58) Field of Classification Search
CPC ............. H01Q 1/364; H01Q 3/44; H03C 7/02
USPC ....................................................... 343/893
See application file for complete search history.

(56) References Cited

U.S. PATENT DOCUMENTS

| | | | | |
|---|---|---|---|---|
| 4,530,489 A * | 7/1985 | Hirano | ............... | B60G 17/0272 188/285 |
| 5,712,566 A * | 1/1998 | Taicher | ................ | G01N 24/081 324/303 |
| 6,130,612 A * | 10/2000 | Castellano | ......... | G06K 19/0723 340/572.2 |
| 6,273,965 B1 * | 8/2001 | Pulvirenti | ............. | H01F 1/0306 148/301 |
| 7,851,971 B2 | 12/2010 | Chang | | |
| 10,132,699 B1 * | 11/2018 | Pillars | ..................... | G01L 1/106 |
| 10,510,945 B1 * | 12/2019 | Langlois | ................... | H03H 9/22 |
| 2007/0188397 A1 * | 8/2007 | Parsche | .................. | H01Q 3/446 343/788 |

(Continued)

OTHER PUBLICATIONS

U.S. Appl. No. 16/393,852, filed Apr. 24, 2019, McKnight.

(Continued)

*Primary Examiner* — Don P Le
(74) *Attorney, Agent, or Firm* — Ladas & Parry

(57) ABSTRACT

The impedance of a loopstick antenna is directly modulated utilizing a mechanically actuated magnetoelastic material preferably placed in the core (or center) of looped wires forming the loopstick antenna. Using one or more mechanical actuators the permeability in the center of the loopstick antenna can be modulated at a rapid rate (such as with data or audio information), allowing the magnetic field outside of the antenna to be modulated at large bandwidths without requiring switches or modulators capable of high voltage thus reducing the overall complexity and cost of the transmitter. The external magnetic field is created by an AC source which is preferably impedance matched to the loopstick antenna by means of a matching network and is FM modulated according to a modulating signal applied to the one or more mechanical actuators.

21 Claims, 2 Drawing Sheets

(56) References Cited

U.S. PATENT DOCUMENTS

| | | | | |
|---|---|---|---|---|
| 2010/0277387 A1* | 11/2010 | Schantz | ............... | H01Q 1/276 |
| | | | | 343/788 |
| 2014/0217932 A1* | 8/2014 | Bright | ................. | H01L 41/06 |
| | | | | 318/118 |
| 2015/0318624 A1* | 11/2015 | Schantz | ................. | G01S 5/14 |
| | | | | 343/867 |
| 2016/0294056 A1 | 10/2016 | Manteghi | | |
| 2017/0040674 A1 | 2/2017 | Suh | | |
| 2017/0279471 A1 | 9/2017 | Manteghi | | |
| 2017/0299757 A1* | 10/2017 | Bench | ................. | G01V 3/15 |
| 2018/0129338 A1 | 5/2018 | Ihalainen | | |
| 2020/0034583 A1* | 1/2020 | Nikitin | ............... | G06K 7/10366 |

OTHER PUBLICATIONS

U.S. Appl. No. 16/393,830, filed Apr. 24, 2019, Wall.
U.S. Appl. No. 16/011,964, filed Jun. 19, 2018, McKnight.
Azad, U., "Direct Antenna Modulation (DAM) for Enhanced Capacity Performance of Near-Field Communication (NFC) Link", IEEE Transactions on Circuits and Systems I: Regular Papers, vol. 61, No. 3, Mar. 2014, pp. 902-1010.
Babakhani, et al., "Transmitter Architectures Based on Near-Field Direct Antenna Modulation", IEEE Journal of Solid-State Circuits, pp. 2674-2692, vol. 43, No. 12, Dec. 2008.
Bickford et al., "Performance of Electrically Small Conventional and Mechanical Antennas", IEEE Transactions on Antennas and Propagation, vol. 67, No. 4, Apr. 2019, pp. 2209-2223.
Hansen, R.C., "Small Antenna Handbook", John Wiley and Sons, Inc. 2011, Chapter 3, pp. 59-133.
Keller, S.D., et al., "Direct antenna modulation: analysis, design, and experiment", 2006 IEEE Antennas and Propagation Society International Symposium, Jul. 9-14, 2006, pp. 909-912.
Manteghi, M. "An electrically small antenna concept design for transmitting a baseband signal," 2017 IEEE International Symposium on Antennas and Propagation & USNC/URSI National Radio Science Meeting, Jul. 9-14, 2017, pp. 1481-1482.
Xu, et al., "A direct antenna modulation (DAM) transmitter with a switched electrically small antenna," 2010 International Workshop on Antenna Technology (iWAT), Mar. 1-3, 2010 (4 pages).
Yao, et al. "Direct antenna modulation—a promise for ultrawideband (UWB) transmitting", 2004 IEEE MTT-S International Microwave Symposium Digest, Jun. 6-11, 2004, pp. 1273-1276.
From U.S. Appl. No. 16/393,830 (unpublished, non-publication request filed), Office Action dated Apr. 29, 2021.

* cited by examiner

MECHANICALLY MODULATED LOOPSTICK ANTENNA

CROSS REFERENCE TO RELATED APPLICATIONS

This application claims the benefit of U.S. Provisional Patent Application No. 62/689,758 filed 25 Jun. 2018 and entitled "A Mechanically Modulated Loopstick Antenna", the disclosure of which is hereby incorporated herein by reference.

This application is related to U.S. patent application Ser. No. 16/011,964 filed on Jun. 19, 2018 which claims the benefit of U.S. Provisional Patent Application Ser. No. 62/522,519 filed Jun. 20, 2017 and entitled "Vibrational Magnetic Transmitter", the disclosures of which are hereby incorporated herein by reference.

This application is also related to U.S. patent application Ser. No. 16/393,852 filed on the same day as this application and which claims the benefit of U.S. Provisional Patent Application Ser. No. 62/689,759 filed 25 Jun. 2018 and entitled "A Mechanically Actuated Magnetostrictive Dipole Transmitter", the disclosures of which are hereby incorporated herein by reference.

This application is also related to U.S. patent application Ser. No. 16/393,830 filed on the same day as this application and which claims the benefit of U.S. Provisional Patent Application Ser. No. 62/689,755 filed 25 Jun. 2018 and entitled "A Mechanically Actuated and Shunted Magnetostrictive Dipole Transmitter", the disclosures of which are also hereby incorporated herein by reference.

STATEMENT REGARDING FEDERALLY SPONSORED RESEARCH OR DEVELOPMENT

This invention was made in the course of work done pursuant to US Government contact No. HR0011-17-C-0117 awarded by the Defense Advanced Research Projects Agency (DARPA) and therefore the US Government may have certain rights in this invention.

TECHNICAL FIELD

The disclosed technology related to a loopstick antenna which may be used to transmit or communicate at frequencies below 100 MHz. These frequencies are useful for communication over the horizon or in highly conductive environments such as underground or underwater.

BACKGROUND

Traditional compact antennas below 100 MHz consist of electrically small dipoles, monopoles, and loops. In general the latter is often the most efficient for size constrained applications. Furthermore, loop antennas can be loaded at their cores with high permeability materials and may comprises numerous wire loops (which may be called a coil), dramatically improving its efficiency for a given size. This type of antenna is known as a loopstick antenna. For extremely subwavelength applications (i.e. <λ/100) loopstick antennas have a large inductive reactance associated with their impedance. To match this reactance, capacitors can be utilized. However, if good transmit efficiency is to be achieved with these matching networks the transmit bandwidth associated with the antenna will be exceedingly small.

A technique to circumvent this issue which has been proposed previously is to directly modulate the reactive elements of the matching network instead of modulating the signal incident on the network. This technique, known as direct antenna modulation, allows for large fractional bandwidths to be achieved (near 100%); however, for reasonable power levels, the high quality factors associated with reactive elements in this network create large voltages which increase the cost, complexity, and reliability of switches needed to achieve modulation. See, for example, a. Xu, J. X. and Wang, Y. E., "A direct antenna modulation (DAM) transmitter with a switched electrically small antenna", 2010 *International Workshop on Antenna Technology (iWAT)*, 1-3 Mar. 2010;

b. Azad, U. and Wang, Y. E., "Direct Antenna Modulation (DAM) for Enhanced Capacity Performance of Near-Field Communication (NFC) Link", *IEEE Transactions on Circuits and Systems I: Regular Papers*, Vol. 61, Is. 3, March 2014;

c. Yao, W. and Wang, Y., "Direct antenna modulation—a promise for ultra-wideband (UWB) transmitting", 2004 *IEEE MTT-S International Microwave Symposium Digest*, 6-11 Jun. 2004 d. Babakhani, A., Rutledge, D. B.; and Hajimiri, A., "Transmitter Architectures Based on Near-Field Direct Antenna Modulation", *IEEE Journal of Solid-State Circuits*, pp. 2674-2692, 12 Dec. 2008;

e. Keller, S. D., Palmer, W. D. and Joines, W. T., "Direct antenna modulation: analysis, design, and experiment", 2006 *IEEE Antennas and Propagation Society International Symposium*, 9-14 Jul. 2006;

f. Suh, S-Y, et al, "Time-variant antenna module for wireless communication devices", U.S. Patent Publication 2017/0040674, 2017 Feb. 9;

g. Manteghi, M. "Transmitting Wideband Signals Through an Electrically Small Antenna Using Antenna Modulation", U.S. Patent Publication 2017/0279471, 2017 Sep. 28;

h. Manteghi, M. "An electrically small antenna concept design for transmitting a baseband signal", 2017 *IEEE International Symposium on Antennas and Propagation & USNC/URSI National Radio Science Meeting*, 9-14 Jul. 2017;

i. Manteghi, M. et al., "A time variant antenna for transmitting wideband signals", U.S. Patent Publication 2016/0294056, 2016 Oct. 6;

At electromagnetic (EM) frequencies less than 100 MHz, compact and efficient antennas and transmitters have been difficult to produce. At very low frequencies (VLF) 3-30 kHz and ultra low frequencies (ULF) 0.3-3 kHz electromagnetic waves are challenging to produce, because the physical size of the antenna, which is a fraction of a single wavelength, becomes impractically large. Antennas for VLF and ULF transmitters can be as large as many acres and require wires suspended hundreds of feet off the ground for efficient operation. Loopstick antennas, which are essentially solenoids loaded with high permeability materials allow for significant reductions in the size of antennas at VLF and ULF. However, because these antennas are generally matched with a reactance in a resonant circuit to improve the efficiency, the bandwidths are often extremely narrow.

One option to avoid this bandwidth issue is to directly modulate the reactive elements of the matching network, however for transmitters of reasonable power levels this can often result in high voltages placing undesirable constraints on the transmitter and its antenna system. Also, losses in the switch used to modulate the reactive element can significantly degrade efficiency.

BRIEF DESCRIPTION OF THE INVENTION

This invention addresses this high voltage issue by directly modulating the impedance of the loopstick antenna with a mechanically actuated magnetoelastic material preferably placed in the core (or center) of looped wires forming a loopstick antenna. Using one or more mechanical actuators the permeability in the center of the loopstick antenna can be modulated at a rapid rate (such as with data or audio information), allowing the magnetic field outside of the antenna to be modulated at large bandwidths without requiring switches or modulators capable of high voltage thus reducing the overall complexity and cost of the transmitter. The external magnetic field is created by an AC current or voltage source which is preferably impedance matched to the loopstick antenna by means of a matching network and is FM and/or AM modulated according to a modulating signal applied to the one or more mechanical actuators.

In accordance with embodiments of the disclosed technology, the permeability of a loopstick antenna is modulated, preferably via mechanical actuation of a magnetoelastic material, allowing the reactance of the loopstick antenna to be modulated instead of the reactance of a matching network. This implementation of direct antenna modulation has the advantage of avoiding the use of high voltage switching elements.

In accordance with embodiments of the disclosed technology, a coil of wire with a magnetoelastic material such as terfenol-D, or galfenol ($Fe_xGa_{1-x}$) in or adjacent to the coil. Using an alternating voltage source, current is passed through the coil generating a magnetic field external to the coil. By applying a modulated mechanical stress to the magnetoelastic material of this coil its permeability can be modulated, thus modulating the external magnetic field allowing signals and data to be encoded for transmission.

DETAILED DESCRIPTION

Figure 1:
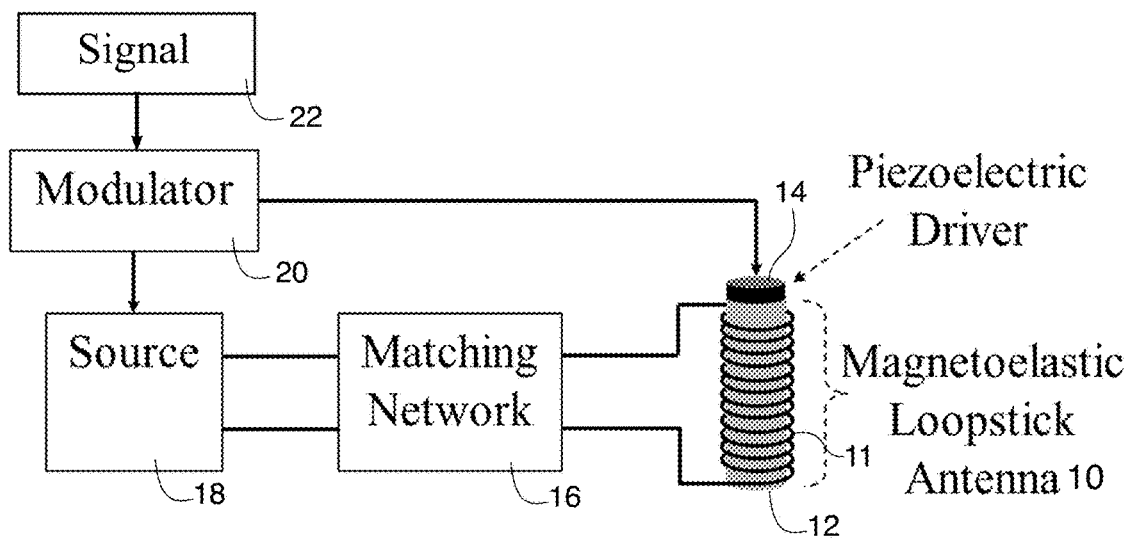
FIG. 1 is a schematic drawing of the disclosed mechanically modulated loopstick antenna and supporting electronic components.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

In this description we will first provide an overview of the principle components and function, then provide a technical rational for the operational principle, and finally discuss design variations.

Magnetic antennas typically consist of coiled wire driven by sources of current or voltage. In the case of an electrically small loop antenna consisting of a single or multiple turns of wire the intrinsic impedance seen at the input terminals of the antenna is given by the following equations (see R. C. Hansen & R. E. Collin, "Small Antenna Handbook", John Wiley and Sons, Inc. 2011):

$$Z_{ant} = R_1 + R_r + jX_{ant}$$

$$R_1 = \frac{R_s D}{2a}$$

$$R_r = \frac{5\pi^2 N^2 k^4 D^4 \mu_e^2}{4}$$

$$X \cong 60\pi N^2 kD\left(\ln\frac{9D}{b} - 1\right)$$

where, $R_l$ is the ohmic loss in windings, $R_r$ is the radiation resistance, $X$ is the reactance, $R_s$ is the surface resistivity of the wire windings, $D$ is the loop diameter, $a$ is the tube radius, $N$ is the number of turns, $k$ is the free space wave number, $\mu_e$ is the permeability of the core, and $b$ is the axial length of solenoid.

Since the reactive impedance of the antenna is positive, a matching network consisting of capacitive elements is required for good efficiency. In the case of a small air core loop antenna operating below 100 kHz, the radiation resistance is exceedingly small. Furthermore, the capacitive reactance and quality factor required to efficiently match the antenna are often very large, resulting in either poor efficiency or small bandwidths. One technique for mitigating this issue is load the center of an air core loop with a high permeability material such as a ferrite material. This antenna design is known as a ferrite-loaded loop or loopstick. Assuming that low loss ferrite materials are used the radiation resistance and reactance of the antenna can be rewritten as follows (see R. C. Hansen & R. E. Collin, "Small Antenna Handbook", John Wiley and Sons, Inc. 2011):

$$R_r = \frac{5\pi^2 N^2 k^4 L^4 \mu_e^2}{4(L/2A)^4}$$

$$X = \frac{30\pi^2 N^2 k L \mu_e}{(L/2A)^2}$$

where L is the length of the core and A is the radius of the windings. In this design, the reactance is linearly proportional to the permeability of the core. Thus for a constant capacitive match, the resonant frequency of the transmitter can be varied by modifying the permeability of the core.

In embodiments of the present invention, the traditional ferrite material core used to load the center of a prior art loopstick antenna 10, for example, is replaced with a ferromagnetic core 12 having magnetoelastic ("magnetoelastic" is also called "magnetostrictive" in the art) properties. As such, at least a portion of core 12 should comprise a magnetoelastic material $12_{MS}$ (see FIG. 2). The magnetoelastic (or magnetostrictive) material $12_{MS}$ preferably comprises galfenol (an alloy of iron and gallium: $Fe_xGa_{1-x}$) or terfenol-D (an alloy of iron, terbium, and dysprosium for example, $Tb_xDy_{1-x}Fe_2$ and related alloys) or some other magnetoelastic (or magnetostrictive) material such as, for example, Ni, FeGaB, iron cobalt and/or Alfenol ($Fe_xAl_{1-x}$).

Magnetoelasticity (sometimes also called magnetostrictivity) is the coupling of an internal magnetization of a ferromagnetic material to its mechanical strain state. The orientation of the ferromagnetic moment is primarily determined by the interaction of the magnetization with applied field (Zeeman energy), the magnetocrystalline anisotropy (MCA), and the applied stress, or magnetoelastic coupling. The orientation of the magnetization within the material will be always found in a direction that minimizes the energies associated with these forces. When stress is introduced into the magnetoelastic material $12_{MS}$ the effective permeability material changes in response to the applied stress. Depending on the type of magnetoelastic material, different changes may occur upon the application of tensile or compressive stress. For some materials, like galfenol, tension tends to increase the relative permeability of the material (qualitatively making the material more like iron) while compression reduces the effective permeability of the material (qualitatively making the material more like air).

There are other magnetostrictive materials than those identified above which may be utilized or which may be developed in the future for magnetostrictive material $12_{MS}$. It is to be understood that the discovery of new materials which are highly magnetostrictive (also called magnetoelastic in the art) is ongoing and moreover the discovery of new materials which exhibit very little magnetostrictiveness is also on going. So current magnetic materials can exhibit little or relatively large amounts of magnetostrictiveness. In this disclosure the term magnetostrictive (or magnetoelastic) material is intended to refer to magnetic materials whose magnetostrictiveness λ is at least 20 microstrains (50 microstrains is approximately the value of Ni). Generally speaking, the higher the number of microstrains the better for material $12_{MS}$, but there can be an engineering tradeoff since materials with greater magnetostrictiveness may be more expensive to utilize and may have greater temperature sensitivities (for some magnetostrictive alloys such as FeGaB, the Curie temperature can be as low as 350° C.). For the purposes of this disclosure, non-magnetostrictive (or non-magnetoelastic) material has a λ that is less than 20 microstrains.

The antenna 10 will likely work with any magneto-elastic material, it will work best with materials that have stress induced permeability changes that range from high values to very low values. Galfenol is much better in this regard than Terfenol-D, and thus galfenol is the presently preferred material for magnetoelastic material $12_{MS}$ in ferromagnetic core 12.

Figure 2:
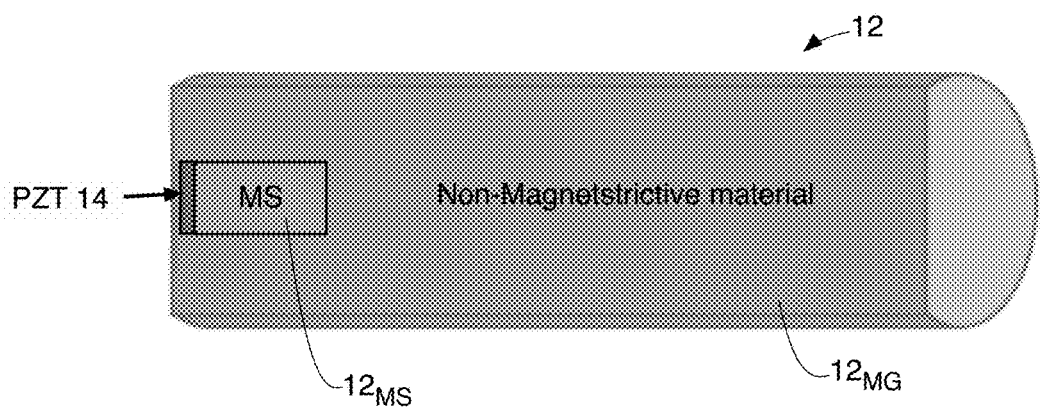
FIG. 2 is a cross sectional, perspective view thru the core of the loopstick antenna.

As is depicted by FIGS. 1 and 2, wire 11 is wound around a ferromagnetic core 12 which includes a magnetoelastic (or magnetostrictive) material $12_{MS}$ thereby forming the coil or loop 11 of the magnetoelastic loopstick antenna 10. As can be seen from FIG. 2, the core 12 may include a relatively smaller amount of a magnetoelastic (or magnetostrictive) material $12_{MS}$ such as galfenol and a relatively larger amount of a ferromagnetic, but non-magnetoelastic material $12_{MG}$ such as MetGlas®. In some embodiments, the ferromagnetic core 12 may comprise a unitary body of a magnetoelastic (or magnetostrictive) material or have a greater portion of a magnetoelastic (or magnetostrictive) material (compared to a non-magnetoelastic (or non-magnetostrictive) material), especially if the magnetoelastic (or magnetostrictive) material selected does not enjoy the same degree of magnetoelasticity as does galfenol.

Also, it should be noted that MetGlas® may made from any a number of different metallic glass alloys, some of which are magnetoelastic and others which are not magnetoelastic (or less so). So MetGlas® alloys may be used for both the magnetoelastic (or magnetostrictive) material $12_{MS}$ and for the ferromagnetic, but non-magnetoelastic, material $12_{MG}$, provided that a magnetoelastic (or magnetostrictive) MegGlas® alloy is selected for material $12_{MS}$ and that a ferromagnetic, but non-magnetoelastic, MegGlas® alloy is selected for material $12_{MG}$. In some embodiments, a magnetoelastic (or magnetostrictive) MegGlas® alloy (or even a non MetGlas® alloy) may be designed (or selected) which forms the entirety or majority of core 12.

The term alloy above is used in its broadest possible sense and is not intended to exclude mixtures or composite materials. For just one example, gaflenol is typically referred to as an alloy of FeGa in the art, but the Ga tends to clump together in the Fe matrix much like "raisins within a cake" according to one researcher.

All ferromagnetic materials tend to exhibit some magnetoelastic (or magnetostrictive) properties. The reference herein to magnetoelastic (or magnetostrictive) materials or properties is intended to refer to those materials which exhibit the greatest change in permeability for a range of applied stresses, such as gaflenol, while the reference to non-magnetoelastic (or non-magnetostrictive) materials or properties is intended to refer to those materials such as common ferrites which are minimally magnetostrictive.

Typically, the coil or loop 11 is formed by one or more wires disposed, wound or wrapped around core 12 so that core is preferably located at or near the center of coil or loop 11. Other arrangements, such as having the coil or loop 11 disposed adjacent or inside core 12 may be utilized, but the then the magnetic coupling between the core 12 and the coil or loop 11 likely will be reduced. When wound around core 12 the length of the wire forming the coil or loop 11 is preferably less than one 10th of the free space wavelength of antenna 10 at its resonant frequency. In some embodiments, multiple coils or loop 11 may be utilized for use with different frequencies of interest. The coil or loop 11 is coupled to a matching network 16.

Mechanical stress (which is modulated with information to be transmitted) is applied to magnetoelastic material $12_{MS}$ in core 12 via a mechanical actuator 14, such as a piezoelectric (PZT) driver. When in compression the permeability of the magnetoelastic material $12_{MS}$ decreases, reducing the reactance of the antenna 10, and as this compressive stress is reduced and/or converted into tension, the permeability of the material $12_{MS}$ is increased thus increasing the reactance of antenna 10. By connecting this mechanically tuned loopstick antenna 10 to (i) a capacitor (or a capacitive matching network 16 shown in FIG. 1, which network 16 may be embodied by a single capacitor if desired) and (ii) a variable frequency (current or voltage) source 18, an efficient compact frequency modulated RF source of external magnetic energy is created.

In FIG. 1, the output of the modulator 20 is preferably applied to both the mechanical actuator 14 and the source 18. When a strain is applied to the magnetoelastic core of the loopstick antenna (by the mechanical actuator 14), the permeability of the core 12 changes which in turn changes the resonant frequency of the antenna 10. As such, the driving frequency of the source 18 is also preferably changed to match the resonant frequency of the antenna 10 utilizing the connection depicted between modulator 20 and source 18. The modulator 20 modulates the mechanical actuator 14 using audio or data from a signal source 22 and also changes the frequency of the RF generated by source 18 (but without modulating the source 18) as mentioned above to account for a high Q of the antenna 10.

Figure 3:
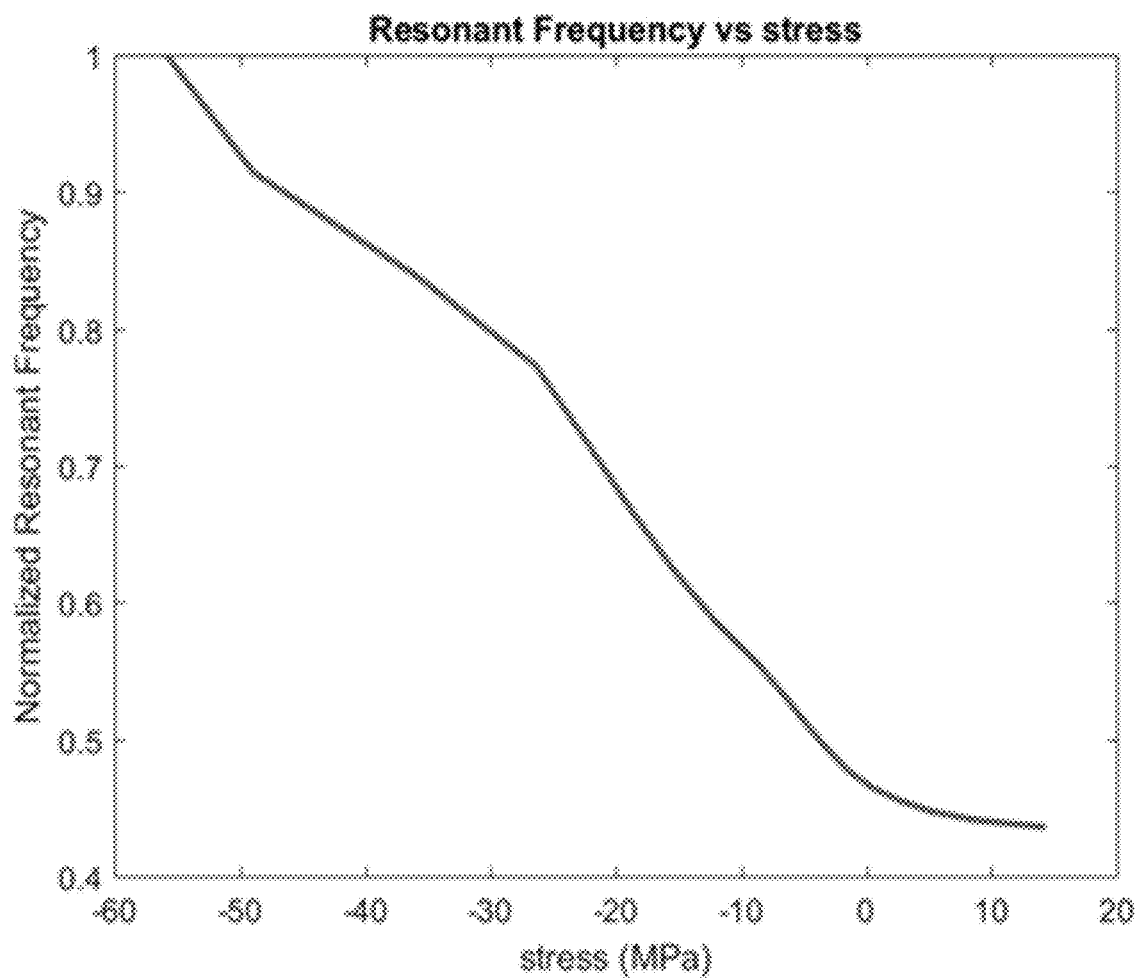
FIG. 3 is a graph showing the tuning of resonant frequency of a magnetoelastic loopstick antenna by changing mechanical stress.

A preferred embodiment of the present invention comprises a 15 cm long cylinder or core of galfenol with a diameter of 8.2 mm. Copper wire is wrapped around the cylinder in a spiral configuration (forming coil 11) and connected to a matching network 16 and voltage source 18 (which may comprise an oscillator and a RF amplifier). Multiphysics simulations of this device demonstrate that using between 20 MPa of tension and 60 MPa of compression a greater than 50% change in the resonant frequency of the loopstick antenna can be achieved (see FIG. 3). To minimize losses, the core 12 material may comprise material $12_{MS}$ which is preferably embodied as galfenol and which preferably constitutes some fraction, less than 100%, of the total material in core 12 with the remaining material $12_{MG}$ consisting of some highly permeable but low loss material such as a ferrite material, such as a non-magnetostrictive material as depicted by FIG. 2 and described above with reference thereto.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . ." and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An antenna comprising a core comprising a first portion of a magnetoelastic material and a second portion of a non-magnetoelastic material, the core being disposed in a coil comprising a conductive wire disposed around a perimeter of the core, the conductive wire connected or coupled, in use, to a matching network which in turn is connected or coupled to a voltage or current source.

2. The antenna of claim 1 wherein the first portion of magnetoelastic material, in use, is placed under mechanical strain via a mechanical driver disposed adjacent the volume of magnetoelastic material, the mechanical driver being actuated, in use, in response to a modulator which also controls a frequency of the voltage or current source.

3. The antenna of claim 2 wherein the conductive wire has a length which is less than one 10th of a wavelength of a frequency of said voltage or current source.

4. An antenna comprising a volume of a magnetoelastic material wrapped in or with conductive wire around its perimeter with ends of the wire being connected, in use, to an unmodulated voltage or current source for generating electromagnetic waves, the volume of magnetoelastic material, in use, being placed under mechanical strain via a mechanical driver disposed in or adjacent the volume of magnetoelastic material, the mechanical driver being powered by a modulated voltage or current source for inducing a modulation of said electromagnetic waves.

5. The antenna of claim 4 wherein the mechanical driver comprises one or more piezoelectric actuator(s).

6. The antenna of claim 4 wherein the volume of magnetoelastic material comprises at least a material selected from the group consisting of galfenol and terfenol-D.

7. The antenna of claim 4 wherein the magnetoelastic material is an alloy of iron and one of more alloying agents selected from the group consisting of gallium, terbium and dysprosium.

8. A method of transmitting signals or data comprising:
providing a coil of wire containing a magnetoelastic material such as galfenol, Terfenol-D, or FeGa disposed in the coil;

using an alternating voltage or current source for passing a current through the coil thereby generating a magnetic field external to the coil;

applying a varying mechanical stress to the magnetoelastic core of the coil whereby its permeability is modulated, thereby modulating the external magnetic field.

9. The method of claim 8 wherein the varying mechanical stress is modulated thereby allowing signals and data to be encoded for transmission.

10. An apparatus for transmitting signals or data comprising:

a coil of wire disposed around a magnetoelastic material such as galfenol or Terfenol-D preferably disposed in or near the center of the coil;

an alternating voltage or current source for passing a current through the coil thereby generating a magnetic field external to the coil;

a mechanical actuator for applying a varying mechanical stress to the magnetoelastic core of the coil whereby its permeability is modulated, thereby modulating the external magnetic field so that signals and data may be encoded for transmission via the external magnetic field.

11. The apparatus of claim 10 wherein the mechanical actuator for applying a varying mechanical stress to the magnetoelastic core of the coil is a piezoelectric apparatus which, in use, is driven by a modulator for encoding said signals and data on the external magnetic field.

12. A method of modulating the impedance of an antenna with a mechanically actuated magnetoelastic material placed in the antenna, the method comprising mechanically actuating the mechanically actuated magnetoelastic material in response to a modulating signal.

13. The method of claim 12 further including using mechanical actuators for actuating the mechanically actuated magnetoelastic material which changes the permeability of the mechanically actuated magnetoelastic material.

14. The method of claim 13 wherein the antenna is a loopstick antenna and wherein the mechanically actuated magnetoelastic material is disposed in or near the center of the loopstick antenna of claim, thereby allowing a magnetic field to be generated, in use, outside of the antenna to be modulated at large bandwidths without requiring switches or modulators capable of high voltage thus reducing the overall complexity and cost of a transmitter using the loopstick antenna.

15. A method of modulating the reactance of an antenna comprising: forming a driven element of said antenna with a magnetoelastic material and modulating the permeability of the antenna via mechanical actuation of said magnetoelastic material.

16. A method comprising providing a coil of wire containing a magnetoelastic material in or near a center of the coil; passing an alternating current through the coil thereby generating an external magnetic field external to the coil; applying a modulated mechanical stress to the magnetoelastic material of the coil, the modulated mechanical stress including signals and data information whereby the permeability of the magnetoelastic material is modulated according to said signals and data information, thereby modulating the external magnetic field so that said signals and data information are encoded for wireless transmission by the external magnetic field.

17. The method of claim 16 wherein the magnetoelastic material is selected from the group consisting of galfenol, Terfenol-D, and FeGa.

18. The method of claim 16 wherein the wire forming the coil has length which is less than one 10th of a wavelength of the frequency of said alternating current passing through said coil.

19. The antenna of claim 1 wherein the conductive wire of the coil is disposed around outer perimeters of both the first and the second portions of said core.

20. The antenna of claim 1 wherein the first portion of said core comprising a magnetoelastic material is surrounded by a portion of said non-magnetoelastic material.

21. An antenna apparatus having a driven element formed of a magnetoelastic material and a mechanical actuator for modulating the permeability of the magnetoelastic material via mechanical actuation of the magnetoelastic material which mechanical actuation in turn modulates the reactance of the antenna apparatus.

* * * * *